United States Patent
Kawasaki et al.

(10) Patent No.: US 8,754,494 B2
(45) Date of Patent: Jun. 17, 2014

(54) IMAGE SENSING DEVICE INCLUDING THROUGH VIAS ELECTRICALLY CONNECTING IMAGING LENS UNIT TO IMAGE SENSORS

(75) Inventors: Atsuko Kawasaki, Yokohama (JP); Kenichiro Hagiwara, Yokohama (JP); Hirokazu Sekine, Fujisawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 132 days.

(21) Appl. No.: 13/234,471

(22) Filed: Sep. 16, 2011

(65) Prior Publication Data

US 2012/0068291 A1 Mar. 22, 2012

(30) Foreign Application Priority Data

Sep. 21, 2010 (JP) ................. 2010-211431

(51) Int. Cl.
*H01L 31/0203* (2014.01)
*H01L 31/0232* (2014.01)
*H01L 27/146* (2006.01)
*G03B 17/00* (2006.01)
*H04N 5/225* (2006.01)

(52) U.S. Cl.
USPC ........... 257/434; 257/431; 257/432; 257/433; 257/435; 348/340; 396/529

(58) Field of Classification Search
None
See application file for complete search history.

(56) References Cited

U.S. PATENT DOCUMENTS

| 7,759,751 B2* | 7/2010 | Ono ............................. 257/432 |
| 2009/0134483 A1* | 5/2009 | Weng et al. ................... 257/432 |
| 2010/0117176 A1* | 5/2010 | Uekawa ........................ 257/432 |
| 2010/0165172 A1* | 7/2010 | Kawazu ........................ 348/340 |
| 2011/0134303 A1* | 6/2011 | Jung et al. .................... 348/340 |

FOREIGN PATENT DOCUMENTS

JP 2009-158862 7/2009
JP 2010-49181 3/2010

OTHER PUBLICATIONS

U.S. Appl. No. 13/417,424, filed Mar. 12, 2012, Sekine.
Japanese Office Action Issued Nov. 20, 2012 in Patent Application No. 2010-211431 (with English translation).

* cited by examiner

*Primary Examiner* — Michael Jung
(74) *Attorney, Agent, or Firm* — Oblon, Spivak, McClelland, Maier & Neustadt, L.L.P.

(57) ABSTRACT

According to one embodiment, a solid-state image sensing device includes a semiconductor substrate on which a plurality of pixels are arranged, a transparent substrate including a first through via provided in an opening formed in advance to extend through, an adhesive including a second through via connected to the first through via and configured to bond the semiconductor substrate and the transparent substrate while exposing the pixels, and an imaging lens unit arranged on the transparent substrate.

8 Claims, 8 Drawing Sheets

Example of sectional structure (first embodiment)

Adhesive formation (ST4)

Glass substrate bonding (ST5)

IMAGE SENSING DEVICE INCLUDING THROUGH VIAS ELECTRICALLY CONNECTING IMAGING LENS UNIT TO IMAGE SENSORS

CROSS-REFERENCE TO RELATED APPLICATIONS

This application is based upon and claims the benefit of priority from prior Japanese Patent Application No. 2010-211431, filed Sep. 21, 2010, the entire contents of which are incorporated herein by reference.

FIELD

The embodiment described herein relate generally to an image sensing device and a method of manufacturing the same.

BACKGROUND

In recent years, for example, an image sensing device such as the camera module of a cellular phone tends to have an auto-focusing function. The image sensing device having the auto-focusing function needs to include a driving device that moves the imaging lens in a direction perpendicular to the image sensor. For this reason, the device readily becomes bulky and is not suitable for downsizing.

In addition, the method of manufacturing such an image sensing device tends to increase the manufacturing cost.

DETAILED DESCRIPTION

Figure 1:
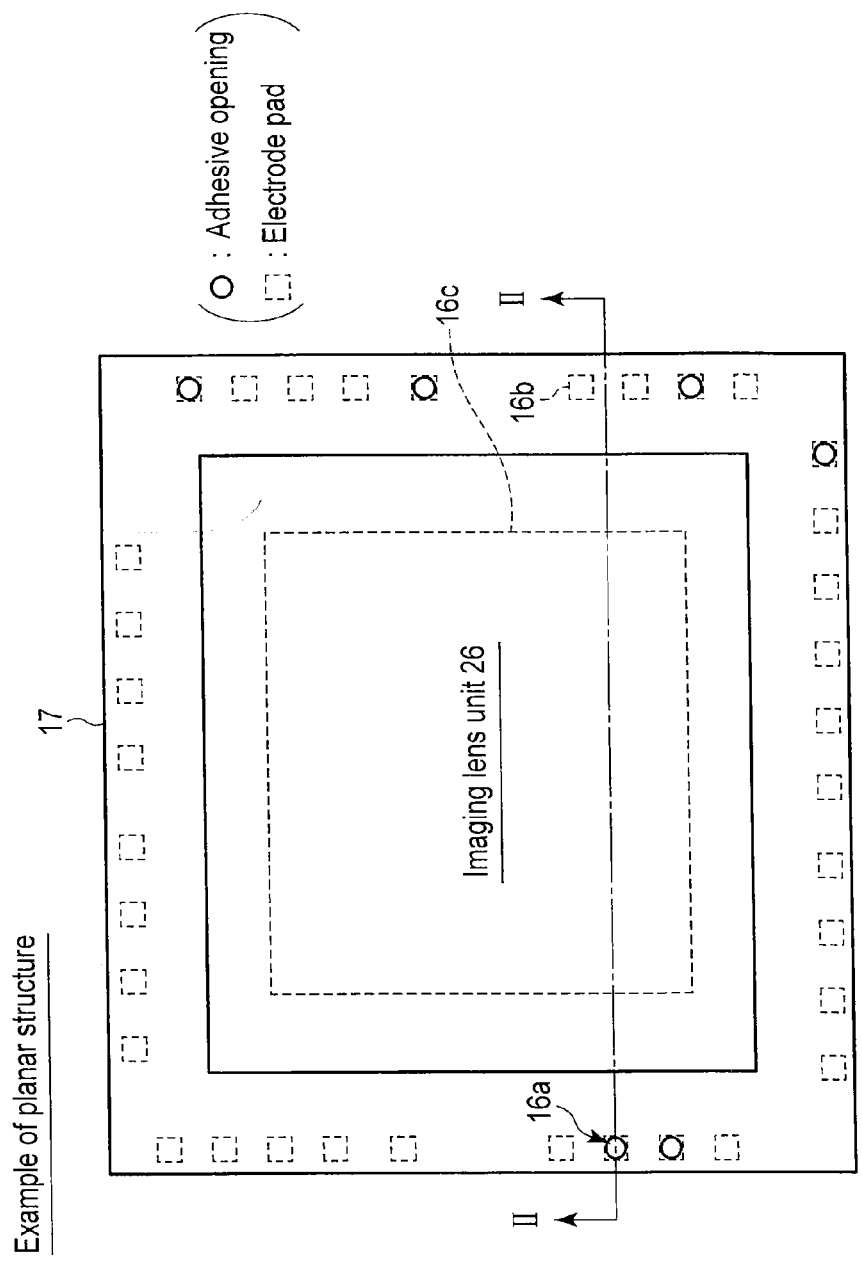
FIG. 1 is a plan view showing an example of the planar structure of an image sensing device according to the first embodiment.

In general, according to one embodiment, a solid image sensing device includes a semiconductor substrate on which a plurality of pixels are arranged, a transparent substrate including a first through via provided in an opening formed in advance to extend through, an adhesive including a second through via connected to the first through via and configured to bond the semiconductor substrate and the transparent substrate while exposing the pixels, and an imaging lens unit arranged on the transparent substrate.

The embodiments will now be described with reference to the accompanying drawings. Note that in the following description, the same reference numerals denote the same parts throughout the drawings.

First Embodiment

An image sensing device according to the first embodiment and a method of manufacturing the same will be described first with reference to FIGS. 1, 2, 3, 4, 5, 6, 7A, and 7B.

1. Structural Example 1-1. Example of Planar Structure

An example of the planar structure of the image sensing device according to the first embodiment will be explained first with reference to FIG. 1.

As shown in FIG. 1, in the example of the planar structure of the image sensing device according to this embodiment, an imaging lens unit 26 is arranged on a glass substrate 17.

The glass substrate (transparent support substrate) 17 has adhesive openings 16a, power supply pads (openings) 16b, and an adhesive opening 16c when viewed from the upper side. The adhesive openings 16a and the power supply pads (openings) 16b are provided using openings that are formed in the glass substrate 17 in advance. Details will be described later.

In this embodiment, the imaging lens unit 26 has an auto-focusing function and is applied to, for example, the camera module of a cellular phone or the like. Details will be described later.

1-2. Example of Sectional Structure

An example of the sectional structure of the image sensing device according to the first embodiment will be explained next with reference to FIG. 2. In this embodiment, the sectional structure taken along a line II-II in FIG. 1 will be exemplified.

Figure 2:
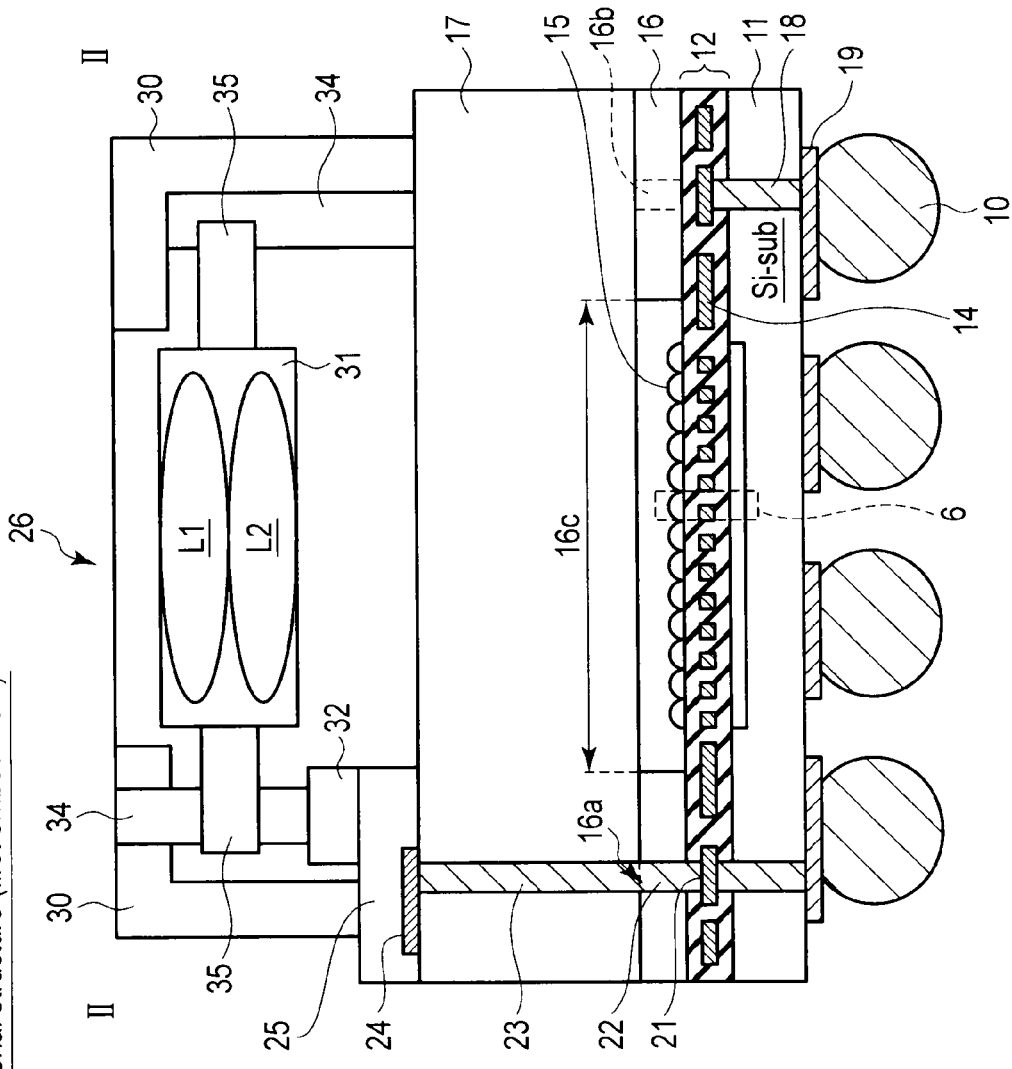
FIG. 2 is a sectional view showing an example of the sectional structure taken along a line II-II in FIG. 1.

As shown in FIG. 2, the image sensing device according to this embodiment comprises pixels 6, an adhesive 16, the glass substrate 17, and the imaging lens unit 26 arranged on (the upper surface of) a silicon substrate (Si-sub) 11. The Si-sub 11 of the image sensing device has, on its lower surface, solder balls 10 each of which is arranged on a back redistribution layer 19 connected to a silicon-via 18 extending through the Si-sub 11.

The plurality of pixels 6 are arranged in a matrix on the Si-sub 11. Each pixel 6 comprises a microlens 15 and an interconnection 14 arranged in an insulating layer 12 and forms a unit pixel.

The adhesive 16 has the adhesive openings 16a and 16c and the electrode pad openings 16b. A conductor is buried in the adhesive openings 16a to arrange through adhesive vias 22. A conductor is buried in the electrode pad opening 16b to arrange an electrode pad electrode (broken line in FIG. 2). The through adhesive via 22 is connected to a through glass via 23 and the through silicon via 18.

The glass substrate 17 comprises the through glass vias 23 and an on-glass redistribution layer 24. The through glass vias 23 are formed by burying a conductor in openings (formed in advance so as to extend through the glass substrate 17) of the glass substrate 17. Hence, the adhesive openings 16a are formed to be aligned with the openings formed in advance to extend through the glass substrate 17. Details will be described later. The on-glass redistribution layer 24 is electrically connected to the through glass via 23 to apply a necessary voltage to a driver IC 25.

In this embodiment, the imaging lens unit 26 comprises the driver IC 25, an envelope 30, lenses L1 and L2, a lens holder 31, an actuator 32, rails 34, and a link member 35. The imaging lens unit 26 has, for example, a function (auto-focusing function) of automatically focusing the image sensing target on the pixels 6 by controlling the distance between the image sensing target and the lenses L1 and L2 under the control of the driver IC 25.

The driver IC 25 controls the actuator 32 so as to control the focal length between the image sensing target and the lenses L1 and L2.

The envelope 30 is arranged around the imaging lens unit 26 to seal it.

The lenses L1 and L2 are provided in the lens holder 31 to do focusing so that the image of the image sensing target is formed on the pixels 6.

The lens holder 31 holds the lenses L1 and L2.

The actuator 32 moves the lenses L1 and L2 along the rails 34 under the control of the driver IC 25. For example, a VCM (Voice Coil Motor), a piezoelectric element, a shape-memory alloy, a MEMS, a liquid lens, or the like is applicable to the actuator 32.

The link member 35 holds the lens holder 31 so that it can move along the rails 34.

2. Manufacturing Method

Figure 3:
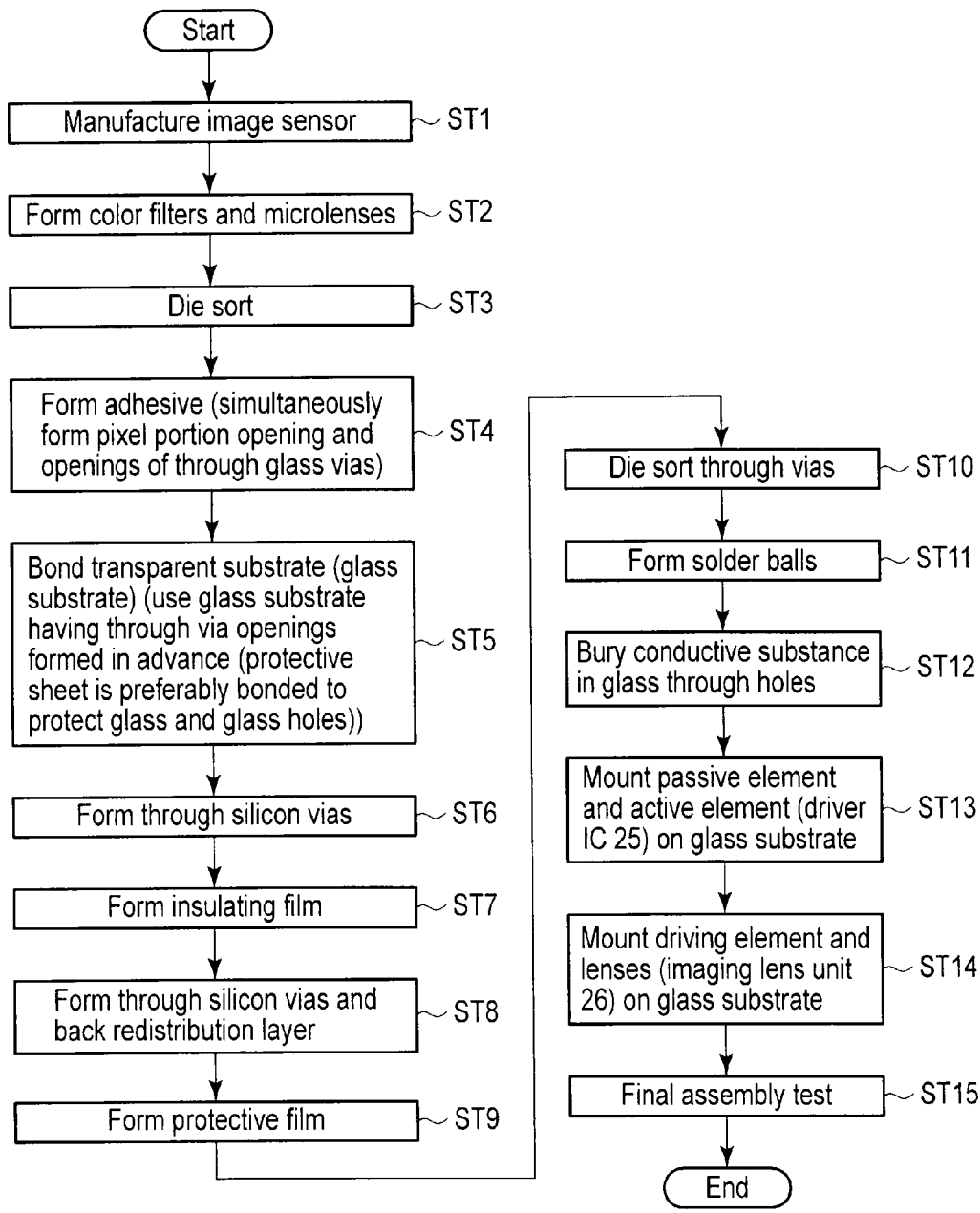
FIG. 3 is a flowchart showing the manufacturing process of the image sensing device according to the first embodiment.

The method of manufacturing the image sensing device according to the first embodiment will be described next with reference to the flowchart of FIG. 3.

(Step ST1)

Photodiodes (not shown), an insulating layer 12, interconnections 14, and the like are formed on an Si-sub 11 to form image sensors.

(Step ST2)

Color filters (not shown) and microlenses 15 are sequentially formed on the Si-sub 11 to form a plurality of pixels 6.

(Step ST3)

The image sensors each including the plurality of pixels 6 on the Si-sub 11 are die-sorted and separated for each predetermined product.

(Step ST4)

Figure 4:
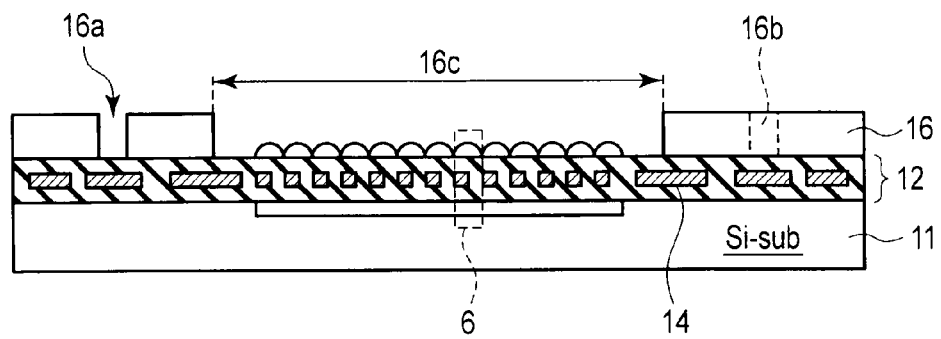
FIG. 4 is a sectional view showing a step in the manufacture of the image sensing device according to the first embodiment.

As shown in FIG. 4, an adhesive 16 is formed on each separated image sensor. At this time, glass via openings 16a and a pixel portion opening 16c are simultaneously formed in the adhesive 16 using, for example, RIE (Reactive Ion Etching) so as to be aligned with openings formed in advance in a glass substrate 17 to be bonded to the adhesive 16 after this step. Note that at this time, since the pixels 6 are exposed, the adhesive 16 is not formed on them (adhesive opening 16c).

(Step ST5)

Figure 5:
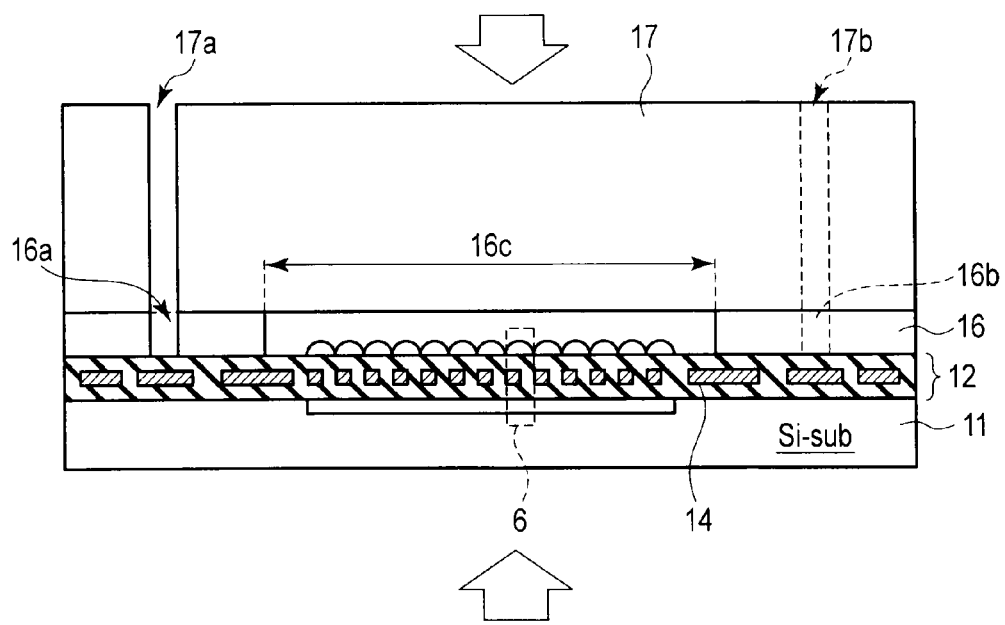
FIG. 5 is a sectional view showing a step in the manufacture of the image sensing device according to the first embodiment.

As shown in FIG. 5, the glass substrate 17 serving as a transparent support substrate is placed on the adhesive 16 and bonded to the Si-sub 11. At this time, the glass substrate 17 is bonded to the Si-sub 11 while aligning openings 17a and 17b formed in advance in the glass substrate 17 with the through glass openings 16a and the pixel portion opening 16c formed in the adhesive 16.

Figure 6:
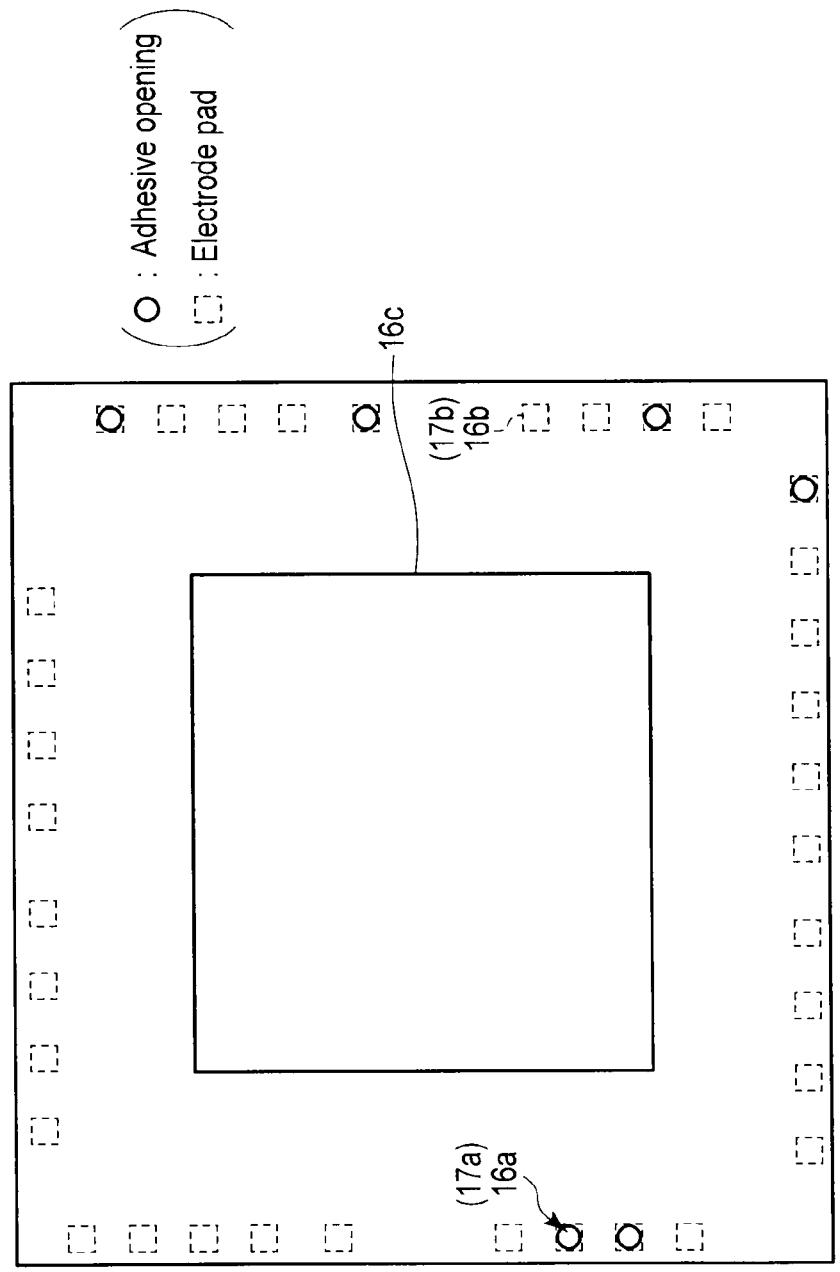
FIG. 6 is a plan view showing a step in the manufacture of the image sensing device according to the first embodiment.

As a result, the glass substrate 17 during this step looks like as in FIG. 6 when viewed from the upper side. As illustrated, when the glass substrate 17 is viewed from the upper side, it is bonded to the Si-sub 11 such that the positions of the openings 17a and 17b formed in the glass substrate 17 in advance match those of the through glass openings 16a and the pixel portion opening 16c formed in the adhesive 16.

Note that in this step, a protective sheet is bonded onto the glass substrate 17 to protect the glass holes 17a and 17b and the glass substrate 17. Bonding the protective sheet onto the glass substrate 17 makes it possible to, for example, prevent dust and the like generated in the manufacturing step from entering the glass holes 17a and 17b.

(Step ST6)

The Si-sub 11 is reversed. Si through holes are formed from the reversed lower surface side so as to extend through the Si-sub 11 and be electrically connected to electrode pads 21. Note that a step of thinning the Si-sub 11 into a thin film may be provided before the step of forming the Si through holes.

(Step ST7)

An insulating film is formed on the Si-sub 11 by, for example, CVD (Chemical Vapor Deposition).

(Step ST8)

A barrier metal of Ni or the like is formed in each Si through hole by, for example, sputtering. A conductor such as Cu (copper) is buried by plating to form through silicon vias 18. Similarly, a back redistribution layer 19 is formed using Cu (copper) or the like.

(Step ST9)

A protective film (not shown) is formed at a necessary position on the Si-sub 11.

(Step ST10)

The through silicon vias 18 are die-sorted.

(Step ST11)

Solder balls 10 are formed on the back redistribution layer 19.

(Step ST12)

A conductive substance such as Cu (copper) is buried in the openings 17a and 17b formed in the glass substrate 17 in advance and the through glass openings 16a and 16b formed in the adhesive 16 by, for example, plating to form through glass vias 23 and through adhesive vias 22. An on-glass redistribution layer 24 is formed on the through glass vias 23 by the same manufacturing step.

(Step ST13)

The driver IC 25 including a passive element, an active element, and the like is mounted on the on-glass redistribution layer 24 of the glass substrate 17.

(Step ST14)

The imaging lens unit 26 including the driving element 32 and the lenses L1 and L2 is mounted on the glass substrate 17 so as to cover the driver IC 25.

(Step ST15)

Finally, a final assembly test is conducted to check whether the manufactured image sensing device normally operates, and the manufacture ends.

3. Functions and Effects

According to the image sensing device of the first embodiment and the method of manufacturing the same, at least the following effects (1) and (2) can be obtained.

(1) Suitable for Downsizing

As described above, the image sensing device according to this embodiment is a camera module comprising the semiconductor substrate 11 on which the plurality of pixels 6 are arranged, the glass substrate (transparent support substrate) 17 including the through glass vias 23 provided in the openings 17a and 17b formed in advance to extend through, the adhesive 16 that includes the through adhesive vias 22 connected to the through glass vias 23 and bonds the semiconductor substrate 11 and the glass substrate 17, and the imaging lens unit 26 arranged on the glass substrate 17 and having the function of automatically focusing an image sensing target onto the pixels 6.

The image sensing device according to this embodiment comprises no bonding wires and the like. For this reason, the image sensing device of this embodiment can reduce the vertical and horizontal sizes using a lens of the same performance (focal length) and is therefore suitable for downsizing.

Figure 7:
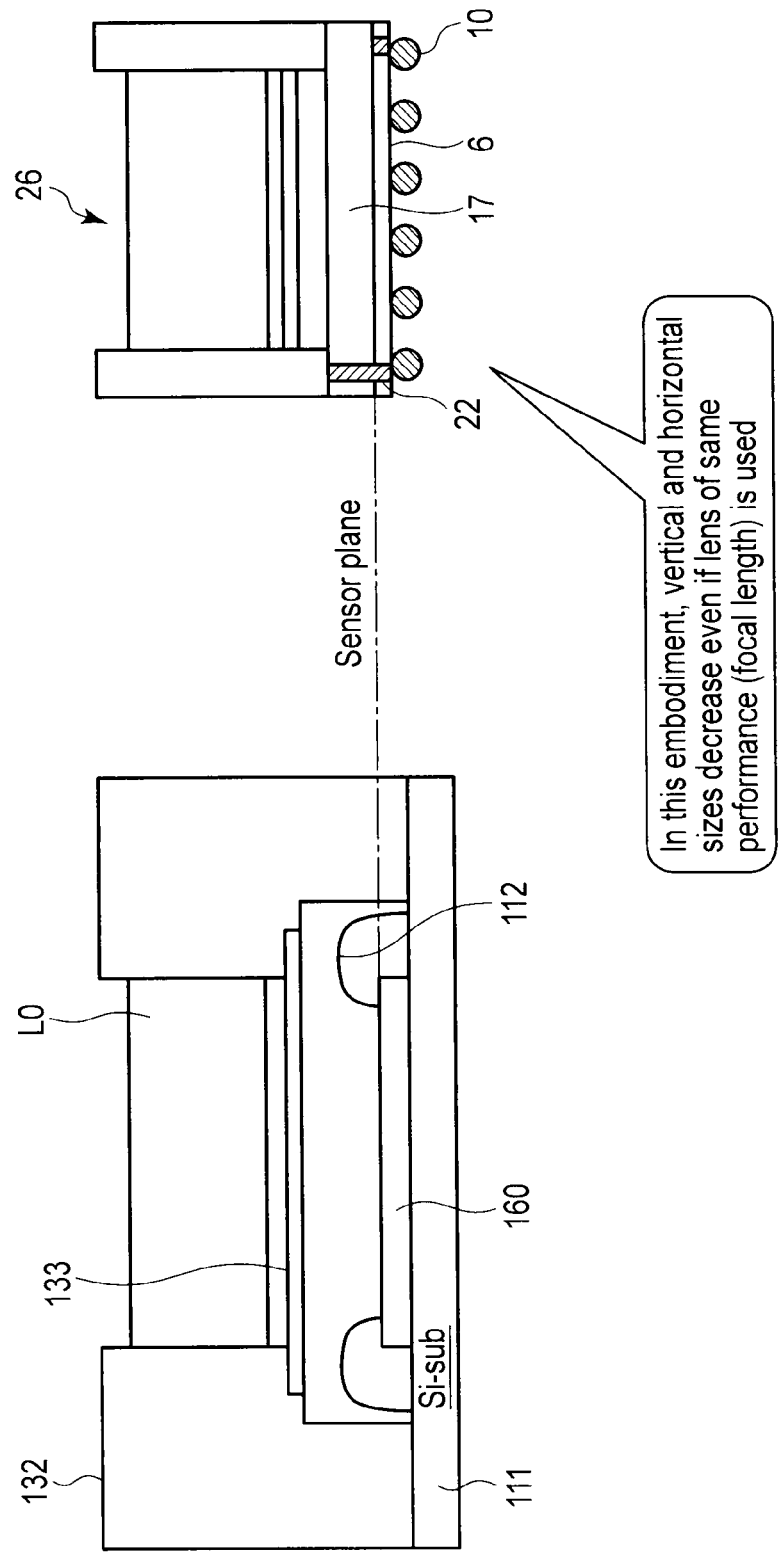
FIG. 7A is a sectional view of an image sensing device according to a comparative example.
FIG. 7B is a sectional view of the image sensing device according to the first embodiment.

For example, FIGS. 7A and 7B show the comparison between this image sensing device and an image sensing device comprising bonding wires and the like. FIG. 7A illustrates the arrangement of an image sensing device according to a comparative example comprising bonding wires and the like. FIG. 7B schematically illustrates the arrangement of the image sensing device according to this embodiment.

As is apparent from FIGS. 7A and 7B, the image sensing device according to this embodiment is suitable for downsizing because it can reduce the vertical and horizontal sizes with respect to the sensor plane as compared to the image sensing device of the comparative example even when using a lens L0 of the same performance (focal length).

(2) Suitable for Manufacturing Cost Reduction

As described above, the image sensing device according to this embodiment can be manufactured using the glass substrate (transparent support substrate) 17 including the through glass vias 23 provided in the openings 17a and 17b formed in advance to extend through.

More specifically, as shown in FIG. 4, when forming the adhesive 16 on the separated image sensor, the openings 16a and the pixel portion opening 16c are simultaneously formed in the adhesive 16 by, for example, lithography so as to be aligned with the openings formed in advance in the glass substrate 17 to be bonded to the adhesive 16 after this step (step ST4). Next, as shown in FIG. 5, when placing the glass substrate 17 on the adhesive 16 and bonding it to the Si-sub 11, the glass substrate 17 is bonded to the Si-sub 11 such that the positions of the openings 17a and 17b formed in the glass substrate 17 in advance match those of the openings 16a and the pixel portion opening 16c formed in the adhesive 16 (step ST5).

Hence, the number of steps in the manufacture can be decreased. In addition, an expensive mask and the like required to form through holes in the glass substrate 17 are unnecessary. As a result, the image sensing device is suitable for manufacturing cost reduction.

Second Embodiment

Example in which Multilayered Interconnections are Applied

An image sensing device according to the second embodiment and a method of manufacturing the same will be described next with reference to FIG. 8. This embodiment is directed to an example in which multilayered interconnections are applied. A detailed description of the same parts as in the above-described first embodiment will be omitted here.

Structural Example

Figure 8:
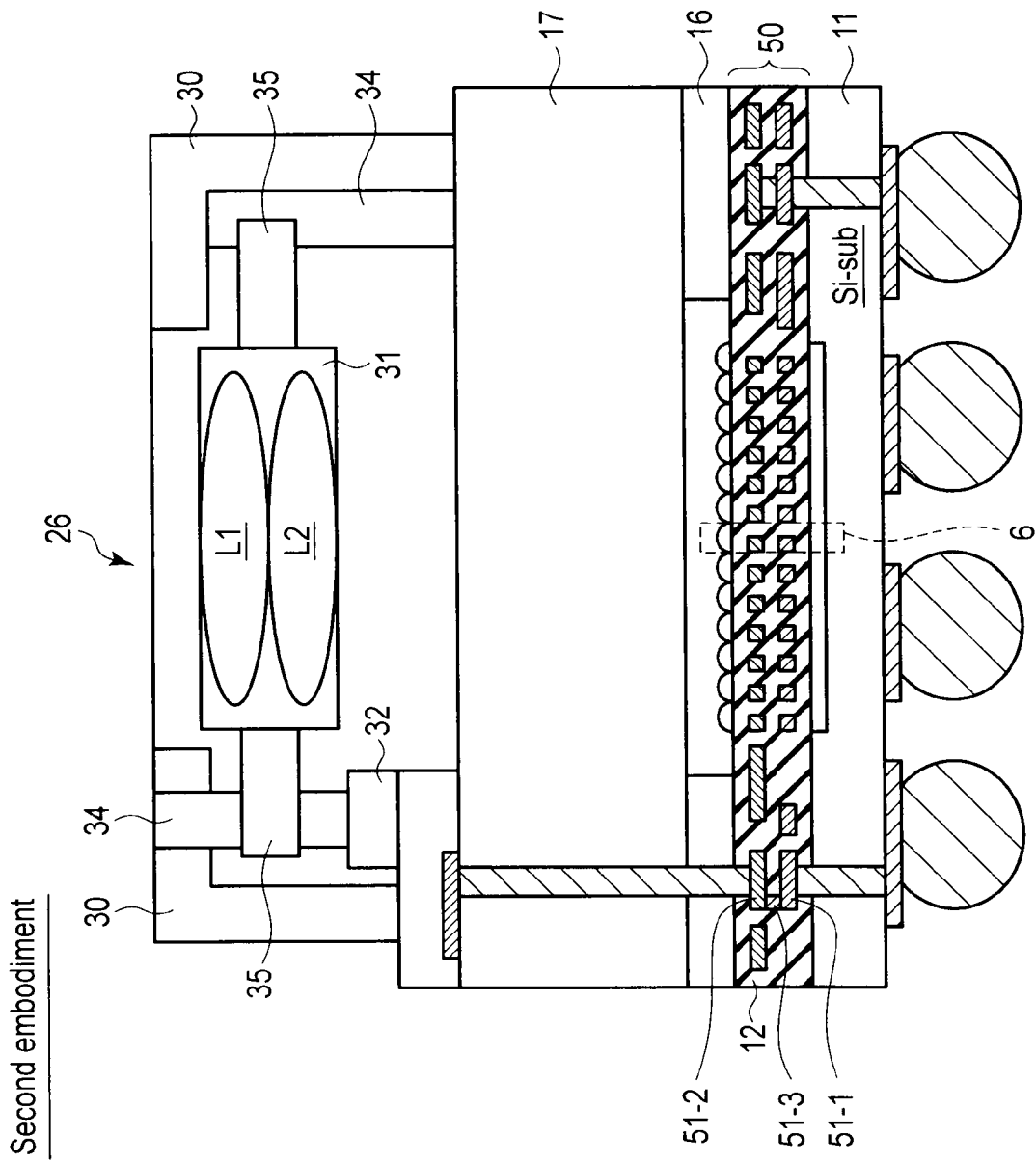
FIG. 8 is a sectional view showing an example of the sectional structure of an image sensing device according to the second embodiment.

FIG. 8 shows an example of the sectional structure of the image sensing device according to the second embodiment.

As shown in FIG. 8, the image sensing device according to this embodiment is different from that of the first embodiment in that the interconnection layer that constitutes the driving circuit portion to drive pixels 6 includes multilayered interconnections 50.

For this reason, the second embodiment is different from the first embodiment in that the device further comprises a plurality of layers of electrode pads 51-1 and 51-2 and a contact 51-3 in an insulating layer 12. The electrode pads 51-1 and 51-2 and the contact 51-3 are electrically connected.

The manufacturing method is almost the same as in the first embodiment, and a detailed description thereof will be omitted.

Functions and Effects

As described above, according to the image sensing device of the second embodiment and the method of manufacturing the same, at least the same effects as (1) and (2) can be obtained. In addition, this embodiment is applicable to an arrangement in which the interconnection layer that constitutes the driving circuit portion to drive the pixels 6 includes the multilayered interconnections 50, like this embodiment.

Third Embodiment

Another Example in which Multilayered Interconnections are Applied

An image sensing device according to the third embodiment and a method of manufacturing the same will be described next with reference to FIG. 9. This embodiment is directed to another example in which multilayered interconnections are applied. A detailed description of the same parts as in the above-described first embodiment will be omitted here.

Structural Example

Figure 9:
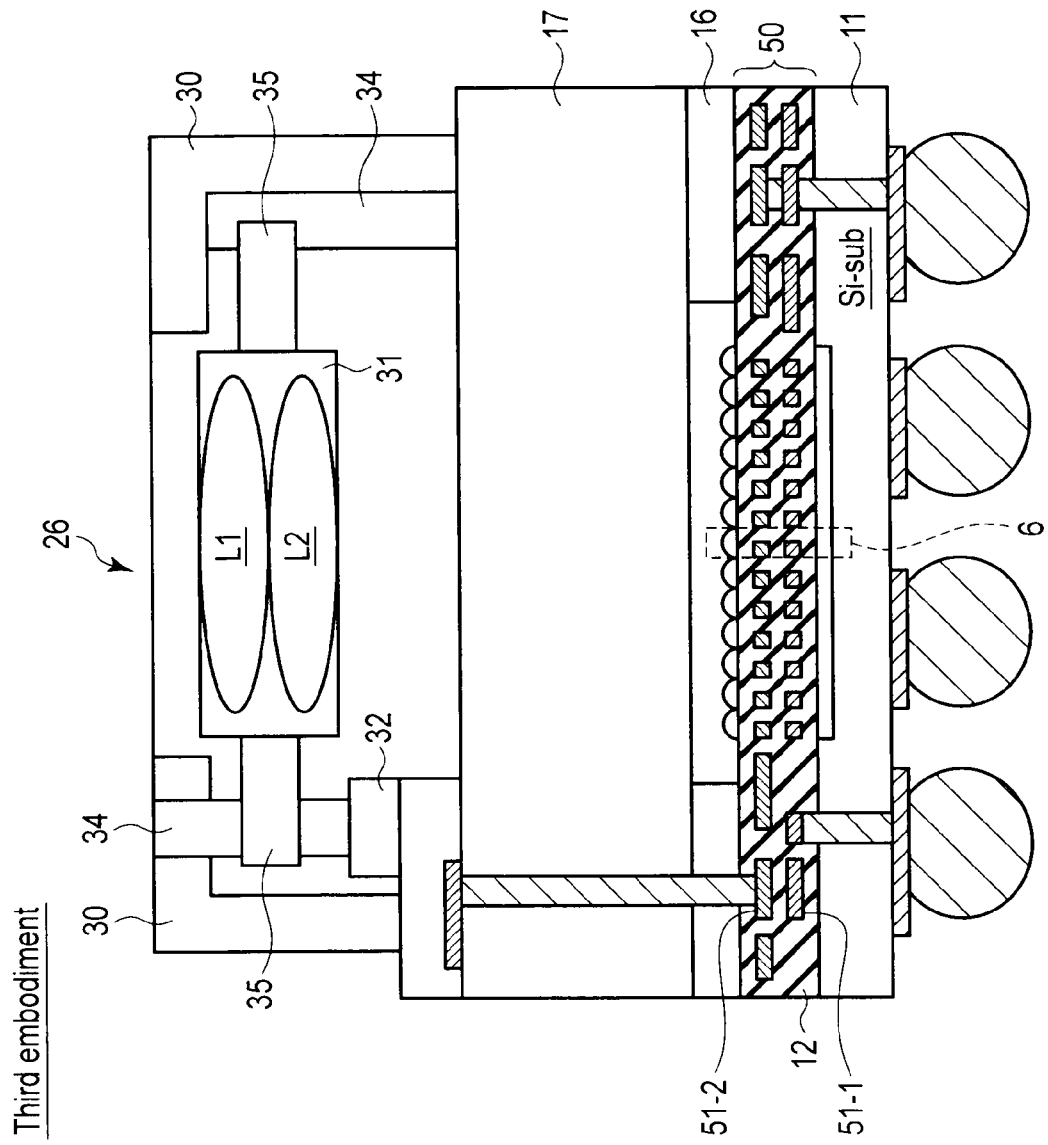
FIG. 9 is a sectional view showing an example of the sectional structure of an image sensing device according to the third embodiment.

FIG. 9 shows an example of the sectional structure of the image sensing device according to the third embodiment.

As shown in FIG. 9, this image sensing device is different from that of the first embodiment in that the interconnection layer that constitutes the driving circuit portion to drive pixels 6 includes multilayered interconnections 50. In this embodiment, the contact is arranged at a position different from that in the second embodiment. For this reason, electrode pads 51-1 and 51-2 are electrically connected in an insulating layer 12.

Functions and Effects

As described above, according to the image sensing device of the third embodiment and the method of manufacturing the same, at least the same effects as (1) and (2) can be obtained. In addition, this embodiment is applicable to another arrangement in which the interconnection layer that constitutes the driving circuit portion to drive the pixels 6 includes the multilayered interconnections 50, like this embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid state image sensing device comprising:
a semiconductor substrate on which a plurality of pixels are arranged;
a transparent substrate including a first hole therein and including a first through via provided in the first hole;
an adhesive including a second hole therein, including a second through via provided in the second hole and connected to the first through via, and configured to bond the semiconductor substrate and the transparent substrate while exposing the pixels;
an imaging lens unit arranged on the transparent substrate;
a back redistribution layer arranged on a lower surface of the semiconductor substrate; and
a third through via electrically connected to the first through via, the second through via, and the back redistribution layer.

2. A solid-state image sensing device comprising:
a semiconductor substrate on which a plurality of pixels are arranged;
a transparent substrate including a first hole therein and including a first through via provided in the first hole;
an adhesive including a second hole therein, including a second through via provided in the second hole and connected to the first through via, and configured to bond the semiconductor substrate and the transparent substrate while exposing the pixels; and
an imaging lens unit arranged on the transparent substrate,
wherein the imaging lens unit has an auto focusing function of automatically focusing an image sensing target onto the pixels.

3. The device of claim 2, wherein the imaging lens unit further includes:
a lens configured to focus the image sensing target onto the pixels;
an actuator configured to move the lens; and
a driver configured to control the actuator so as to control a focal length between the image sensing target and the lens.

4. The device of claim 3, wherein the actuator includes one of a voice coil motor, a piezoelectric element, a shape memory alloy, a MEMS, and a liquid lens.

5. A solid state image sensing device comprising:
a semiconductor substrate on which a plurality of pixels are arranged;
a transparent substrate including a first hole therein and including a first through via provided in the first hole;
an adhesive including a second hole therein, including a second through via provided in the second hole and connected to the first through via, and configured to bond the semiconductor substrate and the transparent substrate while exposing the pixels;
an imaging lens unit arranged on the transparent substrate;
a back redistribution layer arranged on a lower surface of the semiconductor substrate; and
a third through via electrically connected to the first through via, the second through via, and the back redistribution layer,
wherein an interconnection layer to drive the pixels includes multilayered interconnections.

6. A solid-state image sensing device comprising:
a semiconductor substrate on which a plurality of pixels are arranged;
a transparent substrate including a first hole therein and including a first through via provided in the first hole;
an adhesive including a second hole therein, including a second through via provided in the second hole and connected to the first through via and configured to bond the semiconductor substrate and the transparent substrate while exposing the pixels;
an imaging lens unit arranged on the transparent substrate,
wherein an interconnection layer to drive the pixels includes multilayered interconnection, and
wherein the imaging lens unit has an auto focusing function of automatically focusing an image sensing target onto the pixels.

7. The device of claim 6, wherein the imaging lens unit further includes:
a lens configured to focus the image sensing target onto the pixels;
an actuator configured to move the lens; and
a driver configured to control the actuator so as to control a focal length between the image sensing target and the lens.

8. The device of claim 7, wherein the actuator includes one of a voice coil motor, a piezoelectric element, a shape memory alloy, a MEMS, and a liquid lens.

* * * * *